(12) United States Patent
Laroche

(10) Patent No.: US 6,360,239 B1
(45) Date of Patent: Mar. 19, 2002

(54) NOISE-SHAPED COEFFICIENT ROUNDING FOR FIR FILTERS

(75) Inventor: Jean Laroche, Santa Cruz, CA (US)

(73) Assignee: Creative Technology Ltd., Singapore (SG)

( * ) Notice: Subject to any disclaimer, the term of this patent is extended or adjusted under 35 U.S.C. 154(b) by 0 days.

(21) Appl. No.: 09/231,324

(22) Filed: Jan. 13, 1999

(51) Int. Cl.$^7$ .............................................. G06F 17/10
(52) U.S. Cl. ...................................................... 708/300
(58) Field of Search ................................ 708/300, 306; 375/243, 245

(56) References Cited

U.S. PATENT DOCUMENTS

| | | | |
|---|---|---|---|
| 3,843,940 A | * 10/1974 | Ishiguro et al. | 375/245 |
| 3,846,719 A | 11/1974 | Dolby | |
| 4,133,976 A | * 1/1979 | Atal et al. | 375/243 |
| 4,684,983 A | * 8/1987 | Acampora et al. | 375/245 |
| 5,103,229 A | 4/1992 | Ribner | |

OTHER PUBLICATIONS

G.M. Ballou, "Preemphasis" *Handbook for Sound Engineers*, SAMS, Carmel, Indiana, Section 21.6.1. pp. 712–713, (1991).

G.M. Ballou, "Dolby Noise Reduction" *Handbook for Sound Engineers*, SAMS, Carmel, Indiana, Section 25.8.5. pp. 987–988, (1991).

T. Darling and M.J. Hawksford, "Oversampled Analog–to–Digital Conversion for Digital Audio Systems," J. Audio Eng. Soc., 38 (12), Dec. (1990).

M.W. Hauser, "Principles of Oversampling a/d Conversion," J. Audio Eng. Soc., 39(1/2), Jan./Feb. (1991).

* cited by examiner

*Primary Examiner*—Tan V. Mai
(74) *Attorney, Agent, or Firm*—Townsend and Townsend and Crew LLP; Fidel D. Nwamu

(57) ABSTRACT

Improved methods and systems for generating quantized filter coefficients for a desired filter response are provided. One embodiment provides a technique that can be used to quantize the coefficients of finite impulse-response filters in a way that results in better performance than would be possible using simple truncation or rounding. The technique can be applied, e.g., to highpass, lowpass, or bandpass filters.

20 Claims, 5 Drawing Sheets

NOISE-SHAPED COEFFICIENT ROUNDING FOR FIR FILTERS

BACKGROUND OF THE INVENTION

The present invention relates to digital signal processing, and more particularly in one embodiment, to selection of filter coefficients.

In any practical implementation of digital filters, the filter coefficients must be coded on finite length words. As is well known, rounding the coefficients to the nearest available value can deteriorate significantly the filter's response, and it is rarely easy to find an optimal quantized filter.

Quantizing the filter coefficients to N bits introduces an error component which is responsible for the deterioration of the filter's frequency response. Depending on whether rounding or truncating is used, the error component has a maximum amplitude (in time) of half a LSB or one LSB and its undesirable effect is only seen in the stop-band, where the response of the ideal filter is very low and does not mask the error response.

Unfortunately, the error component often severely undermines the efforts put into filter design, by altering the attenuation in the stop-band. Standard ways of coping with this problem include iterative filter design techniques where the design procedure is performed directly in the quantized domain, and exhaustive search for optimal rounding selection.

Iterative filter design techniques usually yield good results, but are computationally expensive, which prohibits their use in real-time applications. Moreover, the techniques tend to be complex and sensitive to initial conditions.

Exhaustive search implies the design of an optimal, non-quantized filter, followed by an exhaustive search, for each coefficient of the optimal quantized value. This approach guarantees a global optimum within the search range, but becomes impractical for filter length above about 20 coefficients, since the number of combinations to test is $2^L$ where L is the number of filter coefficients when rounding towards $\infty$ of $-\infty$ is tested, i.e., taking the integer number immediately below and taking the integer number immediately above, respectively.

What is needed is a computationally efficient technique for selecting quantized filter coefficients that will provide a desired filter response.

SUMMARY OF THE INVENTION

Improved methods and systems for generating quantized filter coefficients for a desired filter response are provided by virtue of the present invention. In one embodiment, a technique is provided to quantize the coefficients of finite impulse-response filters in a way that results in better performance than would be possible using simple truncation or rounding. The technique can be applied, e.g., to highpass, lowpass, or bandpass filters.

In one embodiment, the technique provides a mathematically sub-optimal solution which involves frequency-domain noise-shaping of the quantization error. The quantization error component is moved into a frequency region where it will be harmless, by reducing the impact of the quantization error component in the frequency region where it could be harmful. Considering a highpass filter, for example, one will try to reject most of the quantization error into the high-frequency region where it will be masked by the filter's response, and minimize the error in the low-frequency region to preserve the quality of the stop-band.

A further understanding of the nature and advantages of the inventions herein may be realized by reference to the remaining portions of the specification and the attached drawings.

DESCRIPTION OF THE SPECIFIC EMBODIMENTS

APPLICATIONS

In one embodiment, the present invention provides systems and methods for selecting quantized coeeficients for FIR filters. This technique may be used in any application where FIR filters are employed, e.g., communications, audio signal processing, image processing, etc. In some applications, the filter coefficients will be developed in realtime.

NOISE-SHAPED QUANTIZATION TECHNIQUE

Typically, a first step is generation of an "ideal" time domain filter impulse response which implicitly includes nonquantized filter coefficients. The goal is to develop a quantized version of the impulse response with a frequency-response as close to the non-quantized one as possible.

The impulse response quantization technique rejects most of the quantization error component in a frequency region where it will be harmless, and reduces the impact of the quantization error component in the frequency region where it could be harmful.

Figure 3:
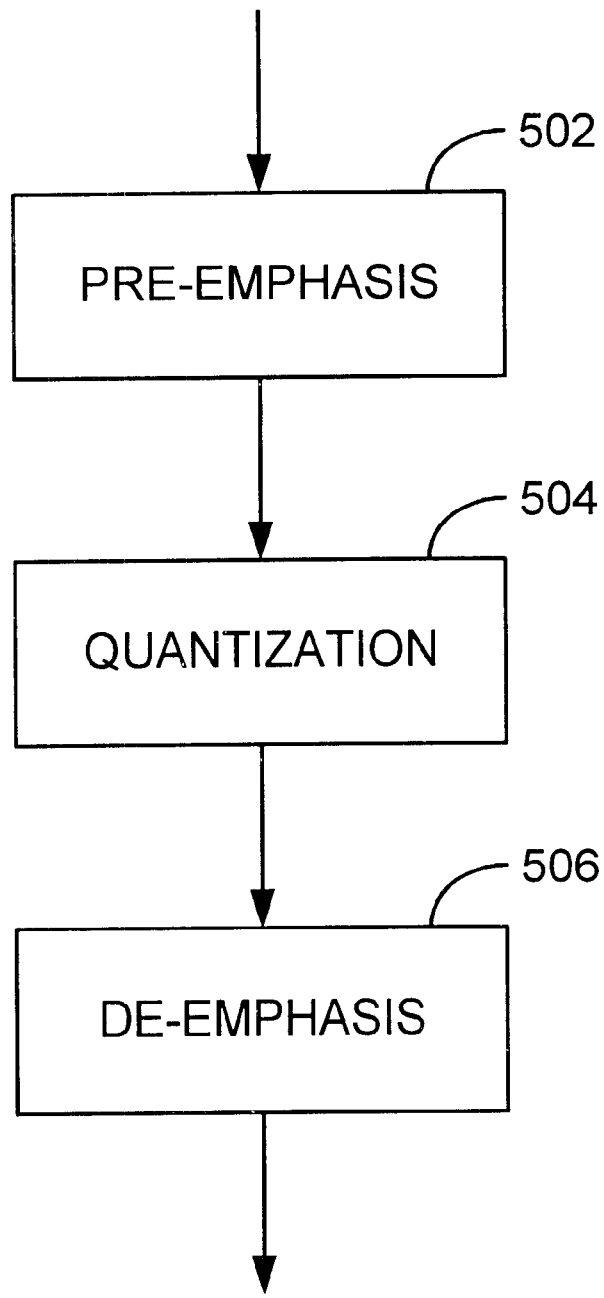
FIG. 3 is a flowchart describing steps of quantizing filter coefficients according to one embodiment of the present invention.

FIG. 3 is a flowchart describing steps of quantizing filter coefficients according to one embodiment of the present invention. FIG. 3 depicts 3 steps.

1. Pre-emphasis of original non-quantized impulse response at step 502.
2. Coefficient rounding of pre-emphasized impulse response at step 504.
3. De-emphasis of quantized pre-emphasized impulse response at step 506.

For optimal performance, these steps should be carried out under certain constraints:

To preserve the original shape of the frequency response, the pre- emphasis and de-emphasis filter should cancel one another. The de-emphasis filter response should be the inverse of the pre-emphasis filter response or substantially similar to the inverse. For example, if P(z) is the Z transform of the pre-emphasis filter, the Z transform of the de-emphasis filter must be 1/P(z).

The de-emphasis stage should yield a filter whose coefficients are still quantized: The de-emphasis filter should be chosen to have integer coefficients.

Both the pre-emphasis and the de-emphasis filters should be stable, or critically stable.

Pre-emphasis

Because of the constraints above, the de-emphasis and the pre-emphasis filters should have integer coefficients, which restricts the number of possible choices. The pre-emphasis filter should amplify the frequency region around the stopband, so that the de-emphasis filter will attenuate it. For example, for a lowpass filter design, the pre-emphasis filter should be a highpass filter, and for a highpass filter design, the pre-emphasis filter should be lowpass. The pre-emphasis filter can either be recursive (IIR) or non-recursive (FIR), but best results have been obtained with FIR pre-emphasis filters, because the corresponding de-emphasis filter is of the IIR type, and generally has better attenuation characteristics. The pre-emphasis filter can be of first, second, or higher order, although pre-emphasis filters of orders higher than 2 have typically been found to result in too extreme noise-shaping, which tends to alter the frequency response in the passband.

Example of integer-coefficients, FIR pre-emphasis filters for lowpass designs include $P(z)=1-z^{-1}$ and $P(z)=(1z^{-1})^2$: filters with simple or double zeros at $z=1$.

For highpass designs, exemplary choices include $P(z)=1+z^{-1}$ and $P(z)=(1+Z^{-1})^2$: filters with simple or double zeros at $z=-1$.

Note that with these choices of pre-emphasis filters, the corresponding de-emphasis filters will be critically stable, i.e., exhibit poles on the unit circle. Of course, the choice is not limited to these examples, although the constraint on integer coefficients limits the possible locations of zeros and poles.

Once the pre-emphasis filter $P(z)$ has been chosen, the ideal, non-quantized impulse response $h(n)$ is filtered by the pre-emphasis filter, yielding a pre-emphasized impulse response $h_e(n)$.

Quantization

Quantization is performed on the pre-emphasized impulse response $h_e(n)$, in accordance with the number of bits allocated to the representation of the filter's coefficients. A standard choice for quantization is rounding, whereby each coefficient in the impulse response is rounded to the nearest multiple of the quantization step q. After quantization, the pre-emphasized, quantized impulse-response $h_e^q(n)$ only comprises integer multiples of the quantization step q.

De-emphasis

De-emphasis is performed on the pre-emphasized, quantized impulse-response $h_e^q(n)$, yielding the desired quantized impulse response $h^q(n)$. Because the de-emphasis filter has integer coefficients, the resulting impulse response is also quantized, i.e., only comprises integer multiples of the quantization step q. Because the de-emphasis filter is usually recursive, with poles possibly lying on the unit circle, care should be taken when applying it to the pre-emphasized, quantized impulse-response $h_e^q(n)$, because the resulting impulse response $h^q(n)$ may exhibit ringing, and therefore no longer be of the FIR type. To make sure this is not the case, the de-emphasis filter is split-up into subfilters with simple poles $z_i$. For example, if the de-emphasis filter is $Q(z)=1/(1-z^{-1})^2$, it is split into two identical first-order sections $Q'(z)=1/(1-z^{-1})$. Applying the de-emphasis filter is equivalent to successively applying each subfilter in series: $h_e^q(n)$ is filtered by the first subfilter, yielding $^1h_e^q(n)$, then the result is filtered by the second subfilter, yielding $^2h_e^q(n)$, and so on. Before applying the ith subfilter, one should assure that the impulse-response to be filtered $^{i-1}h_e^q(n)$ has a zero for each pole of the subfilter.

Figure 4:
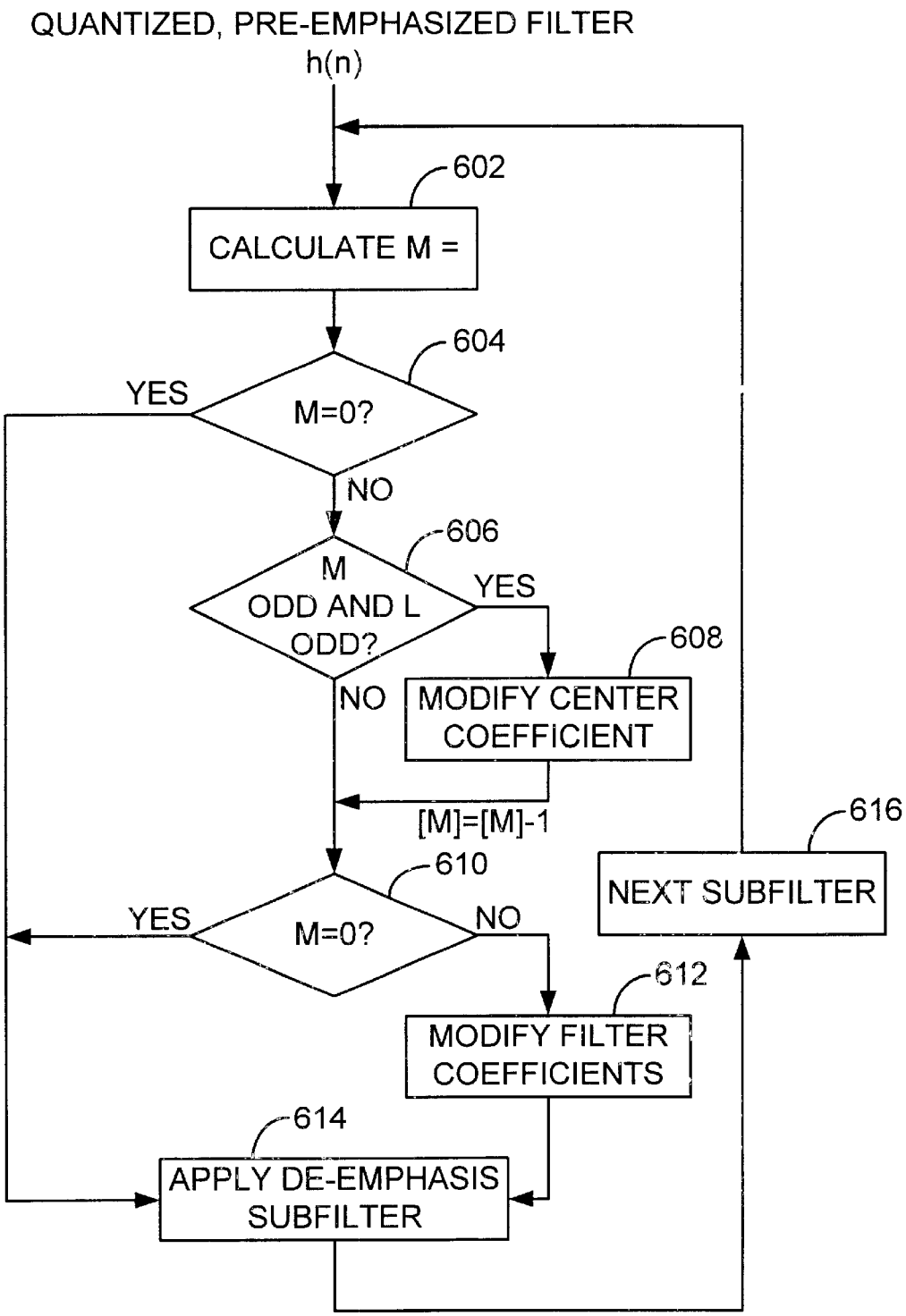
FIG. 4 is a flowchart describing detailed steps of operating an IIR de-emphasis filter according to one embodiment of the present invention.

For de-emphasis subfilters of the type $Q'(z)=1/(1-z^{-1})$, one must make sure that $h_e^q(n)$ has a zero at $z=1$ since $Q'(z)$ has a pole at $z=1$. This is equivalent to assuring that $$\sum_{n=0}^{L-1} h_q^e(n) = 0 \cdot \sum_{n=0}^{L-1} h_q^e(n)$$

is either 0 or an integer number of quantization steps q since $h_e^q(n)$ is an integer number of q. The technique adds or subtracts q from certain filter coefficients to make the sum zero (in which case has a zero at $z=1$). This can be done the following way as depicted in FIG. 4:

1. At step 602, calculate $$M = \frac{1}{q}\sum_{n=0}^{L-1} h_e^q(n) \cdot h_e^q(n)M$$

is an integer.

2. At step 604, determine if $M=0$. If $M=0$, the filter coefficients are not modified.

3. At step 606, determine if M is odd and if the filter length L is odd. If M and L are both odd, at step 608, subtract (if $M>0$) or add (if $M<0$) q from center coefficient $h_e^q(L-1)/2$. Subtract 1 from $|M|$.

4. Determine again if $M=0$ at step 610. If $M \neq 0$ then modify the filter coefficients at step 612 as follows. If $M>0$, find $|M|$ indexes $l_i$ where $h_e^q(l_i)-h_e(l_i)$ is maximum and subtract q from each corresponding filter coefficient.

5. (Step 612 cont.) If $M<0$, find $|M|$ indexes where $h_e(l_i)-h_e^q(l_i)$ is maximum and add q to each corresponding filter coefficient.

At the end of this procedure, $$\sum_{n=0}^{L-1} h_e^q(n)$$

is zero. Adding or subtracting q to filter coefficients inevitably increases the error $$\|h_e^q - h_e\|^2 = \sum_{n=0}^{L-1} (h_e^q(n) - h_e(n))^2$$

since rounding yields the set of quantized coefficients which minimizes this error.

However, the filter coefficients to be modified are chosen so that $\|h_e^q-h_e\|$ will increase as little as possible.

The de-emphasis subfilter is then applied at step 614 to the so-processed coefficients. The technique proceeds to the next subfilter at step 616.

For de-emphasis filters of the type $Q'(z)=1/(1+z^{-1})$, the procedure is similar, except that $h_e^q(n)$ must now have a zero at $z=-1$, which can be expressed as $$\sum_{n=0}^{L-1} (-1)^n h_e^q(n) = 0.$$

The procedure is as follows:
1. At step 602, calculate $$M = \frac{1}{q}\sum_{n=0}^{L-1}(-1)^n h_e^q(n).$$

2. Determine if M=0 at step 604. If M=0, then the filter coefficients are not modified.

3. At step 606, determine if M is odd and if the filter length L is odd. If both M and L are odd, at step 608 add (if M<0) or subtract (if M>0) q from center coefficient $h_e^q(l-1)/2$. Subtract 1 from |M|.

4. Determine again if M=0 at step 610. If M≠0 then modify the filter coefficients at step 612 as follows: If M>0, find |M| indexes $l_i$ where $(-1)^{l_i}(h_e^q(l_i)-h_e(l_i))$ is maximum and subtract $(-1)^{l_i} q$ from each corresponding filter coefficient.

5. (Step 612 cont.) If M<0, find |M| indexes $l_i$ where $(-1)^{l_i}(h_e(l_i)-h_e^q(li))$ is maximum and add $(-1)^{l_i} q$ to each corresponding filter coefficient.

The procedures above are repeated for each subfilter, until the de-emphasized, quantized impulse response is obtained.

It should be noted that the steps of FIG. 4 would not typically be performed for FIR de-emphasis filters since there is then no possibility of a ringing problem.

EXAMPLES

Figure 1A:
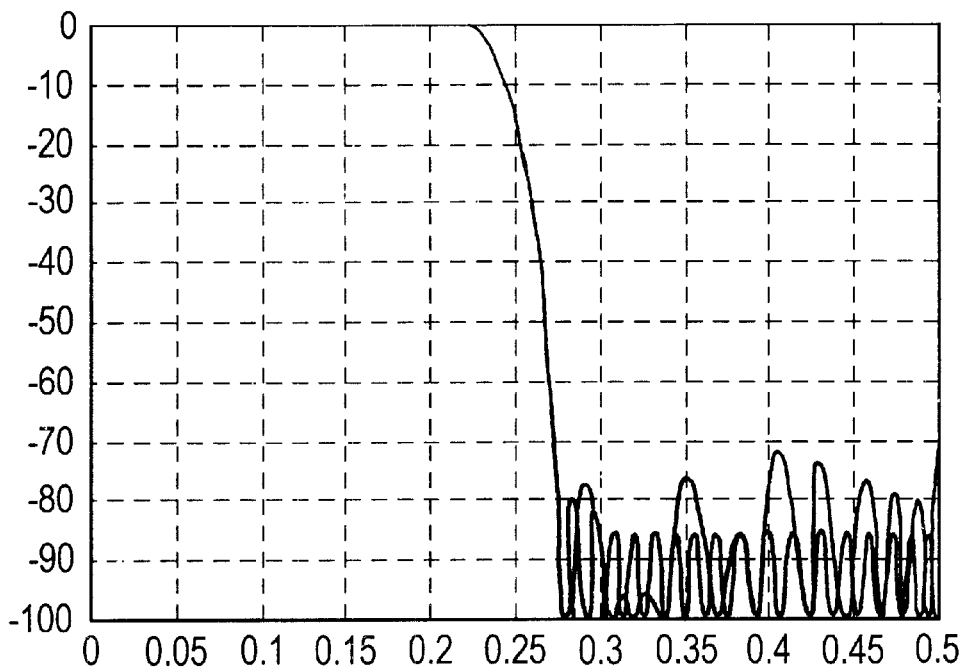
FIG. 1A depicts ideal and quantized frequency responses based on simple rounding of ideal filter coefficients.
Figure 1B:
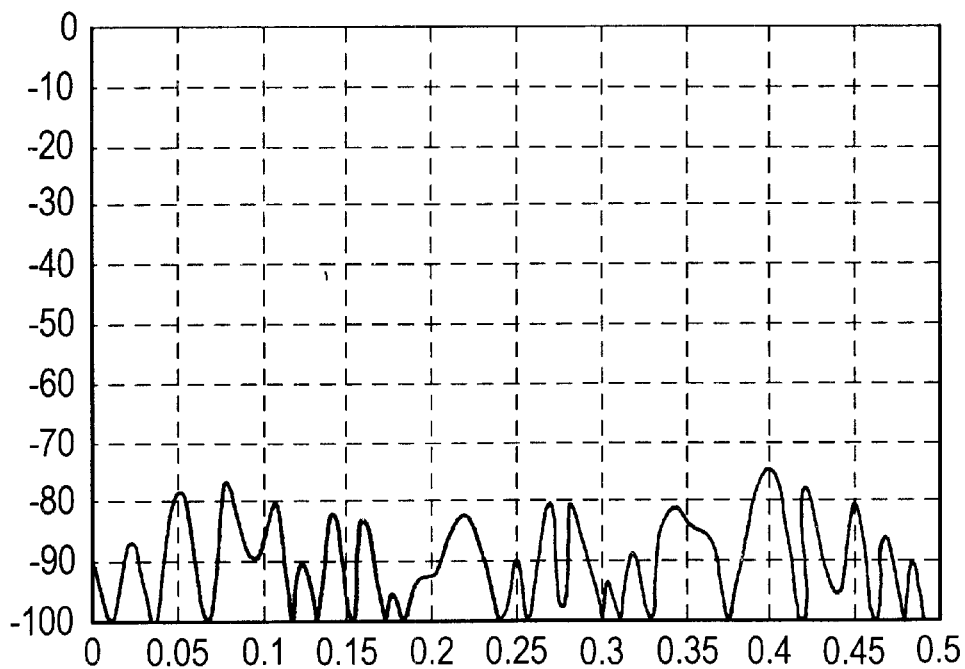
FIG. 1B depicts frequency response of coefficient quantization error based on simple rounding of ideal filter coefficients.

FIG. 1A below shows the ideal frequency response of a half-band lowpass filter, with 65 coefficients. FIG. 1A also shows the frequency response of the quantized filter, when simple rounding is used. Clearly, the stopband was deteriorated by the quantization process. FIG. 1B shows the frequency response of the error component round(h(n))–h(n), which is found to be "flat", in accordance with standard models for quantization noise.

Figure 2A:
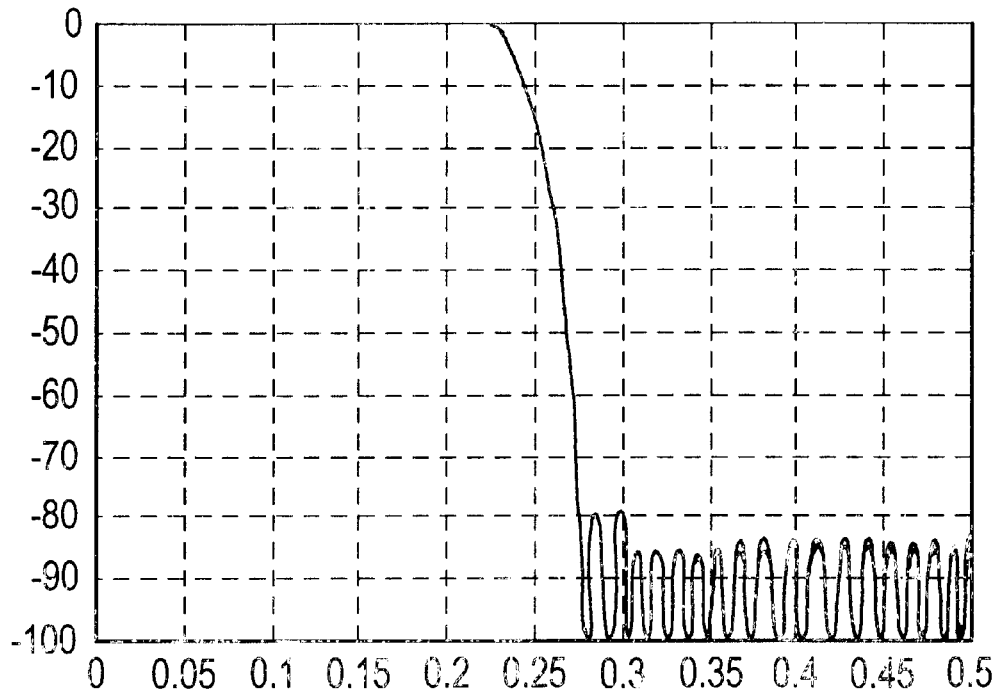
FIG. 2A depicts ideal and quantized frequency responses based on noise-shaped quantization according to one embodiment of the present invention.
Figure 2B:
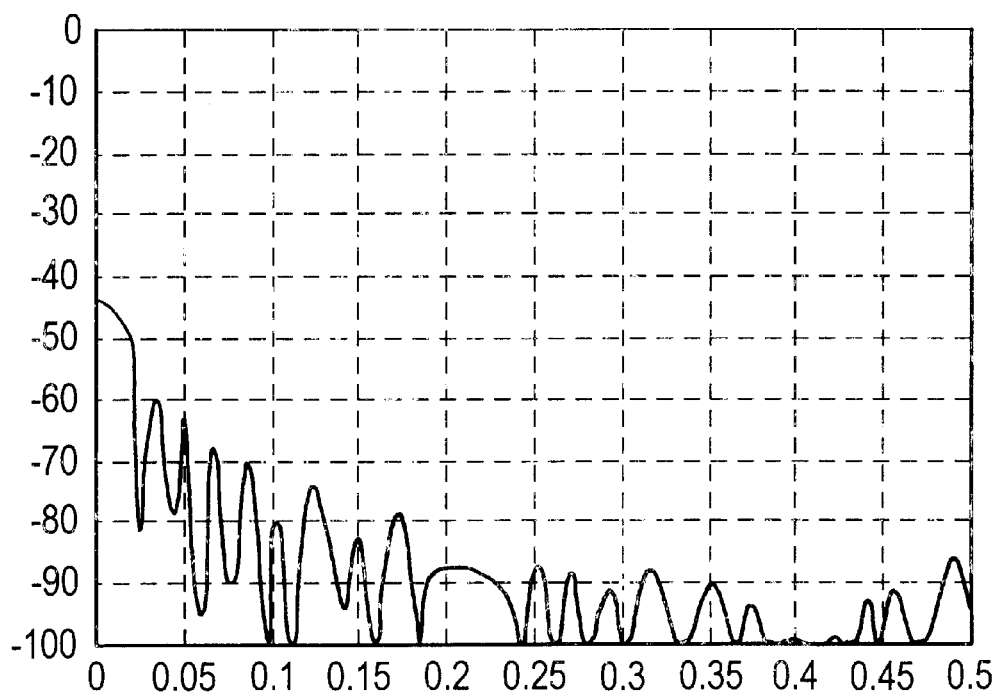
FIG. 2B depicts frequency response of coefficient quantization error based on noise-shaped quantization according to one embodiment of the present invention.

By contrast, FIGS. 2A–2B show the results of using noise-shaped quantization according to one embodiment of the present invention. A pre-emphasis filter $P(z)=(1-z^{-1})^2$ with two zeros at DC was used according to the procedure described above. The quantized filter is found to have a much better stopband, while the error component is no longer flat, but sees most of its energy rejected in the passband, where it is masked by the filter's response.

Representative Hardware

Figure 5:
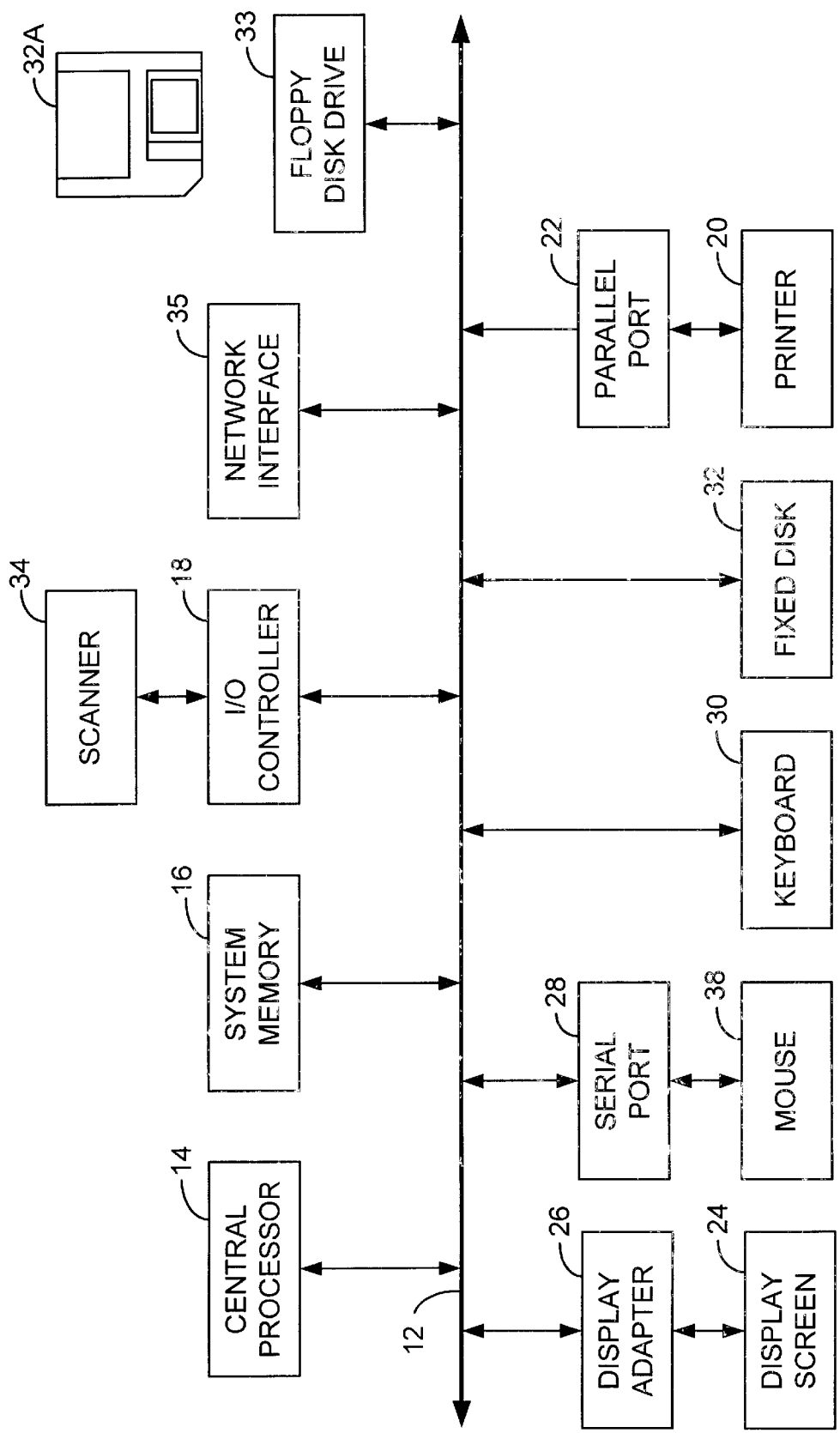
FIG. 5 shows basic subsystems of a computer system suitable for use with the present invention.

FIG. 5 shows basic subsystems of a computer system suitable for use with the present invention. In FIG. 5, computer system 10 includes bus 12 which interconnects major subsystems such as central processor 14, system memory 16, input/output (I/O) controller 18, an external device such as a printer 20 via parallel port 22, display screen 24 via display adapter 26, serial port 28, keyboard 30, fixed disk drive 32 and floppy disk drive 33 operative to receive a floppy disk 33A. Many other devices can be connected such as scanning device 34 connected via I/O controller 18, a network interface 35, a mouse 38 connected via serial port 28. Many other devices or subsystems (not shown) may be connected in a similar manner. Also, it is not necessary for all of the devices shown in FIG. 5 to be present to practice the present invention, as discussed below. The devices and subsystems may be interconnected in different ways from that shown in FIG. 5. The operation of a computer system such as that shown in FIG. 5 is readily known in the art and is not discussed in detail in the present application. Source code to implement the present invention may be operably disposed in system memory 16 or stored on storage media such as fixed disk 32 or floppy disk 33A.

The present invention is implementable by employing only software, only hardware, or any combination of hardware and software. Hardware used for implementing the present invention may include, e.g., dedicating signal processing hardware or a general-purpose computer system as shown in FIG. 5. The steps of deriving filter coefficients as described herein may be performed, e.g., in real-time, as a part of non-real-time automatic filter synthesis, or under direction of an operator.

While the above are complete descriptions of preferred and other embodiments of the invention, other arrangements and equivalents are possible and may be employed without departing from the true spirit and scope of the invention. The terms and expressions which have been employed here are used as terms of description and not of limitations, and there is no intention, in the use of such terms and expressions, of excluding equivalents of the features shown and described, or portions thereof, it being recognized that various modifications are possible within the scope of the appended claims and their full scope of equivalents.

What is claimed is:

1. A method for quantizing coefficients of a non-quantized ideal filter response comprising the steps of:
    pre-emphasizing said non-quantized ideal filter response by application of a pre-emphasis filter to develop a pre-emphasized filter response;
    quantizing coefficients of said pre-emphasized filter response to develop a quantized pre-emphasized filter response;
    de-emphasizing said quantized pre-emphasized filter response by applying a plurality of de-emphasis filters;
    wherein said pre-emphasis filter and said de-emphasis sub-filters have integer coefficients; and
    such that each de-emphasis sub-filter input has a zero for each pole of said one of said sub-filters.

2. The method of claim 1 wherein said de-emphasis filter is stable.

3. The method of claim 1 wherein said de-emphasis filter is critically stable.

4. The method of claim 1 wherein said pre-emphasis filter is an FIR filter.

5. The method of claim 4 wherein said pre-emphasis filter has response $1+z^{-1}$.

6. The method of claim 4 wherein said pre-emphasis filter has response $(1+z^{-1})^2$.

7. The method of claim 1 wherein said quantization step comprises rounding to a number of bits allocated to representing filter coefficients.

8. The method of claim 1 wherein said pre-emphasis filter amplifies in a stop-band of said ideal non-quantized filter response.

9. The method of claim 1 wherein said de-emphasis filter attenuates in a stop-band of said ideal non-quantized filter response.

10. Apparatus for quantizing coefficients of a non-quantized ideal filter response comprising the steps of:
    a pre-emphasis filter for pre-emphasizing said non-quantized ideal filter response to develop a pre-emphasized filter response;
    a quantizer that quantizes coefficients of said pre-emphasized filter response to develop a quantized pre-emphasized filter response;
    a plurality of de-emphasis sub-filters that de-emphasizes said quantized pre-emphasized filter response;
    wherein each de-emphasis sub-filter input has a zero for each pole of said one of said sub-filter; and
    such that the pre-emphasized filter response remains quantized after it is passed through said de-emphasis sub-filters.

11. The apparatus of claim 10 wherein said pre-emphasis filter has integer coefficients.

12. The apparatus of claim 10 wherein said de-emphasis filter has integer coefficients.

13. The apparatus of claim 10 wherein said de-emphasis filter is stable.

14. The apparatus of claim 10 wherein said de-emphasis filter is critically stable.

15. The apparatus of claim 10 wherein said pre-emphasis filter is an FIR filter.

16. The apparatus of claim 15 wherein said pre-emphasis filter has response $1+z^{-1}$.

17. The apparatus of claim 15 wherein said pre-emphasis filter has response $(1+z^{-1})^2$.

18. The apparatus of claim 10 wherein said quantizer rounds to a number of bits allocated to representing filter coefficients.

19. The apparatus of claim 10 wherein said pre-emphasis filter amplifies in a stop-band of said ideal non-quantized filter response.

20. The apparatus of claim 10 wherein said de-emphasis filter attenuates in a stop-band of said ideal non-quantized filter response.

* * * * *